United States Patent
Kotecki et al.

Patent Number: 6,153,491
Date of Patent: *Nov. 28, 2000

[54] OVERHANGING SEPARATOR FOR SELF-DEFINING DISCONTINUOUS FILM

[75] Inventors: David E. Kotecki, Hopewell Junction; William H. Ma, Fishkill, both of N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/865,528

[22] Filed: May 29, 1997

Related U.S. Application Data

[62] Division of application No. 08/865,528, May 29, 1997.

[51] Int. Cl.$^7$ ............................................. H01L 21/20
[52] U.S. Cl. ...................... 438/397; 438/387; 438/399; 257/300; 257/303; 257/532
[58] Field of Search ........................ 257/300, 303, 257/306, 532; 438/387, 397, 399

[56] References Cited

U.S. PATENT DOCUMENTS

| | | |
|---|---|---|
| 4,725,112 | 2/1988 | Bridges et al. ............... 350/96.12 |
| 5,143,861 | 9/1992 | Turner . |
| 5,335,138 | 8/1994 | Sandhu et al. . |
| 5,381,302 | 1/1995 | Sandhu et al. . |
| 5,392,189 | 2/1995 | Fazan et al. . |
| 5,416,042 | 5/1995 | Beach et al. . |
| 5,418,180 | 5/1995 | Brown et al. . |
| 5,436,477 | 7/1995 | Hashizume et al. . |
| 5,478,772 | 12/1995 | Fazan et al. . |
| 5,489,548 | 2/1996 | Nishioka et al. . |
| 5,504,041 | 4/1996 | Summerfelt . |
| 5,506,166 | 4/1996 | Sandhu et al. . |
| 5,534,458 | 7/1996 | Okudaira et al. . |
| 5,550,076 | 8/1996 | Chen et al. . |
| 5,554,564 | 9/1996 | Nishioka et al. . |

*Primary Examiner*—Olik Chaudhuri
*Assistant Examiner*—Douglas A. Wille
*Attorney, Agent, or Firm*—Alison D. Mortinger; Jay H. Anderson

[57] ABSTRACT

A discontinuous film structure on a surface which may be a substrate, with an underlying layer on the surface having a first opening formed therein, a separator layer on the underlying layer having a second opening formed therein, and the second opening overlying the first opening such that the separator layer overhangs the underlying layer. A discontinuous-as-deposited film is formed on the separator layer, with the discontinuity substantially in register with the second opening. The structure is made into a stacked capacitor with the discontinuous film being the bottom electrode, by forming a continuous dielectric layer on the bottom electrode and a continuous top electrode layer on the dielectric layer.

13 Claims, 1 Drawing Sheet

OVERHANGING SEPARATOR FOR SELF-DEFINING DISCONTINUOUS FILM

RELATED APPLICATIONS

This application is adivisional of application Ser. No. 08/865,528, filed May 29, 1997. This invention is related to U.S. Pat. Nos. 5,796,573 titled "Overhanging Separator for Self-Defining Stacked Capacitor," 5,002,575, titled "Adherent Separator for Self-Defining Discontinuous Film", and 5,717,558, titled "Trench Separator for Self-Defining Discontinuous Film", all filed on the same day and assigned to the present assignee.

FIELD OF THE INVENTION

This invention is directed to semiconductor films and the manufacture of the same, more particularly to a self-defining discontinuous film, and most particularly to a capacitor employing a self-defining electrode.

BACKGROUND OF THE INVENTION

Stacked capacitor structures using high-dielectric materials such as $(Ba,Sr)TiO_3$ (BST) require noble metal electrodes, such as platinum, which are very difficult to pattern using conventional semiconductor processing such as reactive ion etching (RIE), ion beam etching, or chemical-mechanical polishing (CMP). Therefore there is a need for a capacitor structure which does not require a separate patterning step to define both electrodes.

For purposes of this invention, the term "oxide" layer is used generally to refer to a layer of silicon dioxide, and the silicon dioxide may be undoped or doped, for example, with boron, phosphorous, or both, to form for example borophosphosilicate glass (BPSG), and phosphosilicate glass (PSG). The silicon dioxide layers may be grown or deposited by conventional techniques.

SUMMARY OF THE INVENTION

It is therefore an object of the present invention to provide a capacitor structure which does not require a separate patterning step to define the electrodes.

It is a further object to provide a structure which is useful for forming a discontinuous film in one process step.

It is a further object to provide such a structure which is feasible for routine manufacturing.

In accordance with the above listed and other objects, a discontinuous film structure on a surface which may be a substrate, with an underlying layer on the surface having a first opening formed therein, a separator layer on the underlying layer having a second opening formed therein, and the second opening overlying the first opening such that the separator layer overhangs the underlying layer. A discontinuous-as-deposited film is formed on the separator layer, with the discontinuity substantially in register with the second opening. The structure is made into a stacked capacitor with the discontinuous film being the bottom electrode, by forming a continuous dielectric layer on the bottom electrode and a continuous top electrode layer on the dielectric layer.

BRIEF DESCRIPTION OF THE DRAWINGS

These and other features, aspects, and advantages will be more readily apparent and better understood from the following detailed description of the invention, in which.

DESCRIPTION OF THE PREFERRED EMBODIMENTS

The present invention is described herein in the context of a stacked capacitor merely as a specific example, and is not meant to limit applicability of the invention to such. Those skilled in the art will understand that the invention is broadly applicable to any structure or method in which it is desirable to have a self-defining discontinuous film structure with a separator layer overhanging an underlying layer and a discontinuous-as-deposited film formed on the separator layer.

Figure 1C:
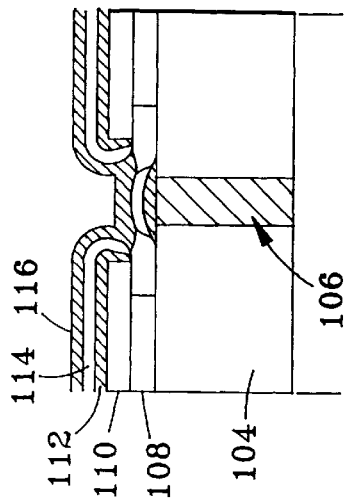
FIGS. 1a–1f are sectional views of the processing steps to manufacture the capacitor structure; all in accordance with the present invention.
Figure 1F:
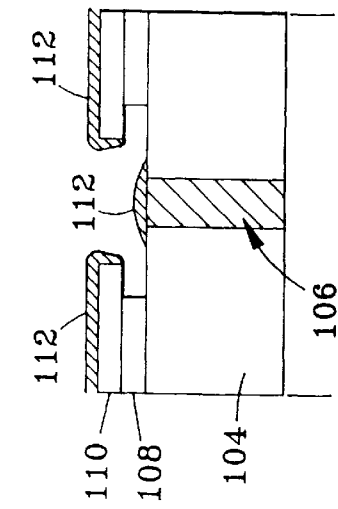
Figure 1B:
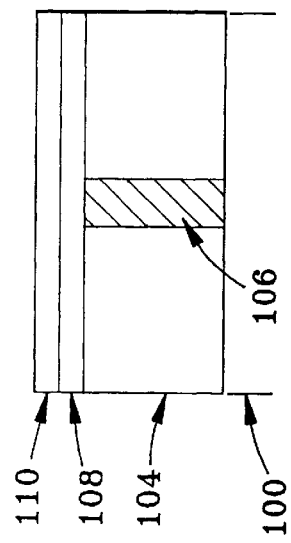
Figure 1E:
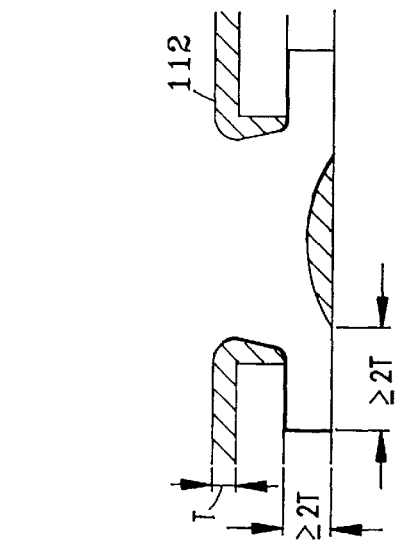
Figure 1A:
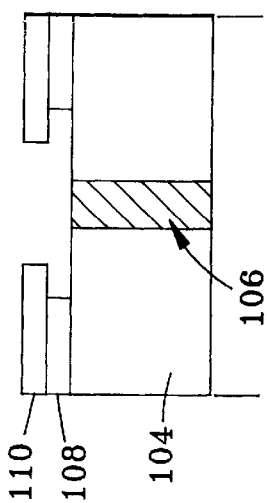

In FIG. 1a, a substrate 100 with a contact region 102 has formed thereon a layer of oxide 104. Note that for certain applications of the capacitor structure to be formed, other circuit elements such as word line and bit line contacts may be fabricated prior to and below the capacitor, within substrate 100 or oxide 104. Oxide 104 has been patterned by forming a hole extending down to contact region 102. A conductive material, for example in-situ doped polysilicon, tungsten, titanium, or various silicides including tungsten and titanium silicides, was then deposited for example by low pressure chemical vapor deposition (LPCVD) followed by planarization to form plug 106. Note that contact area and plug 106 are not required for all applications of the structure.

In FIG. 1b, underlying layer 108 is deposited, followed by separator layer 110. Layers 108 and 110 are patterned to form an opening down to oxide 104, and underlying layer 108 is then recessed with respect to separator layer 110 for example by a selective wet etch in FIG. 1c. Underlying layer 108 may be formed from any material which is selectively etchable with respect to separator layer 110, oxide 104, and plug 106. For example, underlying layer 108 may be an insulator such as an oxide or nitride, with separator layer 110 a nitride or oxide.

Figure 1D:
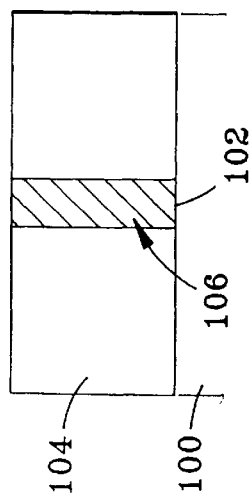

With overhanging separator 110 complete, formation of the stacked capacitor can begin as shown in FIG. 1d. A bottom electrode layer 112 is deposited in a single process step for example by a sputter process, physical vapor depostion, or ion beam deposition which may be made more directional for example by collimation. Bottom electrode 112 may be for example Pt, Ir, Pd, or $IrO_2$ and is preferably a noble metal or noble metal oxide for high dielectric constant capacitor applications. It is important to note that bottom electrode layer 112 is discontinuous, and that the discontinuity is caused by the arrangement of separator 110 and underlying layer 108. Layer 112 can also be characterized as non-patterned, or discontinuous-as-deposited. Even though some electrode material will be deposited within the opening, adjacent capacitors are prevented from shorting together. Thus the bottom electrode is self-forming or self-defining.

FIG. 1e shows the dimensions of the self-defining discontinuous film structure. Optimally, for a non-directional deposition process for layer 112, separator layer 110 overhangs underlying layer 108 by at least twice the thickness T of layer 112. Underlying layer 112 optimally has a thickness greater than or equal to the underhang, or 2T. For a directional process, these dimensions may be smaller, for example half the non-directional values.

The capacitor is completed in FIG. 1f by depositing a dielectric layer 114 followed by a top electrode layer 116. Layers 114 and 116 are deposited by sputtering or CVD, for example. Dielectric 114 is any suitable capacitor dielectric, and is preferably a high-dielectric constant material (i.e. with a dielectric constant over 20) such as $(Ba,Sr)TiO_3$ (BST). Top electrode 116 is preferably from the same group of materials as bottom electrode 112.

In summary, a capacitor structure is provided which does not require a separate patterning step to define the bottom electrode. More generally, a structure is provided which is useful for forming a discontinuous film in one process step, and is thus feasible for routine semiconductor manufacturing.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method of making a capacitor structure, comprising the steps of:

forming an underlying layer on a surface having a first opening therein;

forming a separator layer on the underlying layer having a second opening therein, the second opening overlying the first opening such that the separator layer overhangs the underlying layer;

forming a discontinuous-as-deposited film as a bottom electrode on the separator layer, the discontinuity substantially in register with the second opening;

forming a dielectric layer on the bottom electrode; and forming a continuous top electrode layer on the dielectric layer.

2. The method of claim 1 wherein the underlying layer is selectively etchable with respect to the separator layer.

3. The method of claim 2 wherein the separator layer is an oxide.

4. The method of claim 2 wherein the underlying layer is a nitride.

5. The method of claim 1 wherein the bottom electrode is a material selected from the group consisting of noble metals and noble metal oxides.

6. The method of claim 5 wherein the bottom electrode is platinum.

7. The method of claim 1 wherein the dielectric layer is a high-dielectric constant material.

8. The method of claim 7 wherein the dielectric layer is $(Ba,Sr)TiO_3$.

9. The method of claim 1 wherein the underlying layer has a thickness at least equal to two times a thickness of the discontinuous film.

10. The method of claim 1 wherein the separator layer overhangs the underlying layer by an amount at least two times a thickness of the discontinuous film.

11. The method of claim 1 wherein the discontinuous film is formed using a directional deposition process.

12. The method of claim 11 wherein the underlying layer has a thickness at least equal to the thickness of the discontinuous film.

13. The method of claim 11 wherein the separator layer overhangs the underlying layer by an amount at least equal to the thickness of the discontinuous film.

* * * * *